United States Patent
Fuergut et al.

(10) Patent No.: US 10,020,285 B2
(45) Date of Patent: Jul. 10, 2018

(54) METHOD OF PRODUCING A SEMICONDUCTOR DEVICE AND A SEMICONDUCTOR DEVICE

(71) Applicant: Infineon Technologies Austria AG, Villach (AT)

(72) Inventors: Edward Fuergut, Dasing (DE); Manfred Engelhardt, Villach-Landskron (AT); Hannes Eder, Villach-Landskron (AT); Bernd Roemer, Bernhardswald (DE)

(73) Assignee: Infineon Technologies Austria AG, Villach (AT)

( * ) Notice: Subject to any disclaimer, the term of this patent is extended or adjusted under 35 U.S.C. 154(b) by 18 days.

(21) Appl. No.: 14/476,864

(22) Filed: Sep. 4, 2014

(65) Prior Publication Data

US 2016/0071819 A1    Mar. 10, 2016

(51) Int. Cl.
| | |
|---|---|
| *H01L 25/065* | (2006.01) |
| *H01L 21/78* | (2006.01) |
| *H01L 21/306* | (2006.01) |
| *H01L 21/311* | (2006.01) |
| *H01L 21/56* | (2006.01) |
| *H01L 21/768* | (2006.01) |
| *H01L 23/31* | (2006.01) |
| *H01L 23/48* | (2006.01) |
| *H01L 23/00* | (2006.01) |
| *H01L 25/00* | (2006.01) |

(52) U.S. Cl.
CPC .... *H01L 25/0655* (2013.01); *H01L 21/30604* (2013.01); *H01L 21/31111* (2013.01); *H01L 21/561* (2013.01); *H01L 21/768* (2013.01); *H01L 21/78* (2013.01); *H01L 23/3107* (2013.01); *H01L 23/481* (2013.01); *H01L 24/96* (2013.01); *H01L 25/50* (2013.01); *H01L 21/568* (2013.01); *H01L 23/562* (2013.01); *H01L 2924/13055* (2013.01); *H01L 2924/13091* (2013.01)

(58) Field of Classification Search
CPC .......... H01L 25/0655; H01L 21/30604; H01L 21/31111; H01L 21/561; H01L 21/768; H01L 21/78
USPC .......................................... 438/424
See application file for complete search history.

(56) References Cited

U.S. PATENT DOCUMENTS

| | | | | |
|---|---|---|---|---|
| 2012/0289003 | A1* | 11/2012 | Hirler | H01L 29/42304 438/138 |
| 2013/0189830 | A1* | 7/2013 | Hirschler | H01L 21/6835 438/464 |
| 2013/0241077 | A1* | 9/2013 | Fuergut | H01L 23/492 257/774 |

* cited by examiner

*Primary Examiner* — Fernando L Toledo
*Assistant Examiner* — Lawrence-Linh T Nguyen
(74) *Attorney, Agent, or Firm* — Murphy, Bilak & Homiller, PLLC

(57) ABSTRACT

A method of producing a semiconductor device is provided. The method includes: providing a semiconductor wafer, the wafer including an upper layer of a semiconductor material, an inner etch stop layer and a lower layer; forming a plurality of functional areas in the upper layer; performing a selective first etch process on the upper layer so as to separate the plurality of functional areas from each other by trenches etched through the upper layer, the first etch process being substantially stopped by the inner etch stop layer; and removing the lower layer by a second etch process, the second etch process being substantially stopped by the inner etch stop layer.

20 Claims, 7 Drawing Sheets

METHOD OF PRODUCING A SEMICONDUCTOR DEVICE AND A SEMICONDUCTOR DEVICE

TECHNICAL FIELD

The invention generally relates to a method of producing a semiconductor device, to a semiconductor device and to a semiconductor component.

BACKGROUND

A semiconductor device may include one or multiple semiconductor dies. The semiconductor die or the semiconductor dies may be encapsulated. There is an increasing demand for compact semiconductor devices leading to thinner semiconductor dies. Thin semiconductor dies may be used e.g. in power electronics. In power electronics, vertical devices are known which have a current channel vertical to main surfaces of the semiconductor die. In vertical devices, the thickness of the semiconductor die may influence a channel resistance. The thinner the die, the smaller the channel resistance and the better the performance of the die. Thin semiconductor dies are also used in a wide range of other application as, for example, in sensors.

During production, handling of thin dies may be demanding because thin dies may easily break. The fragility of thin dies may decrease the yield. The fragility may depend on the semiconductor material of the die and on the thickness of the die. Another issue during production of thin dies is warpage. Thin dies and wafers easily warp and accuracy of processing steps is decreased.

Especially in applications where the final chip thickness directly influences the chip performance, respecting a well-defined final thickness may limit value variations of the semiconductor devices.

For these and other reasons there is a need for the present invention.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1:
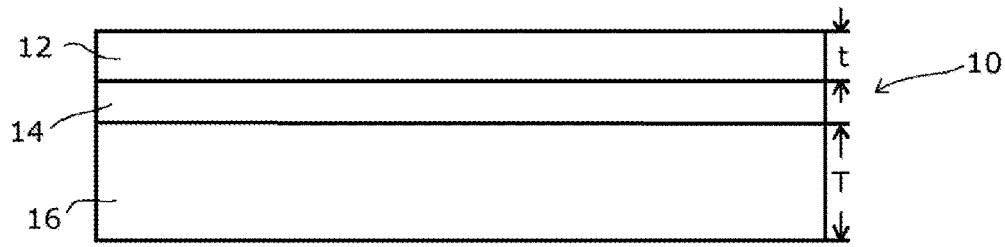
FIG. 1 schematically illustrates a cross-sectional view of a semiconductor wafer used in an embodiment.

In the following detailed description, reference is made to the accompanying drawings, which form a part hereof, and in which is shown by way of illustration specific aspects in which the invention may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is understood that the features of the various exemplary aspects described herein may be combined with each other, unless specifically noted otherwise.

The devices and methods described herein may include or employ one or multiple semiconductor dies or chips. The expressions "die" and "chip" are used throughout the specification interchangeably. The semiconductor dies or chips may be of arbitrary type, may be manufactured by different technologies and may e.g. include integrated electrical, electro-optical or electro-mechanical circuits and/or passives. For example, the semiconductor chips may be configured as power semiconductor chips. The semiconductor chips may include control circuits, microprocessors or micro-electromechanical components. In addition, the devices described herein may include logic integrated circuits to control the integrated circuits of other semiconductor chips, for example the integrated circuits of power semiconductor chips. The semiconductor chips need not be manufactured from specific semiconductor material, for example Si, SiC, SiGe, GaAs, GaN, any other III-V semiconductor and may contain inorganic and/or organic materials that are not semiconductors, such as for example insulators, plastics or metals.

In one example, the semiconductor chips may have a vertical structure, i.e. the semiconductor chips may be manufactured such that electric currents may flow in a direction perpendicular to the main faces of the semiconductor chips. A semiconductor chip having a vertical structure may have electrodes on its two main faces, i.e. on its top side and bottom side (the bottom side may also be referred to as backside herein). In particular, the devices described herein may include a power semiconductor chip that may have such vertical structure. The vertical power semiconductor chips may be configured as power MOSFETs (Metal Oxide Semiconductor Field Effect Transistors), IGBTs (Insulated Gate Bipolar Transistors), JFETs (Junction Gate Field Effect Transistors), power bipolar transistors, power diodes, etc. For example, the source electrode and gate electrode of a power MOSFET may be located on one main face while the drain electrode of the power MOSFET may be arranged on the other main face.

FIG. 1 shows a semiconductor wafer 10. The semiconductor wafer 10 includes an upper layer 12, an inner layer 14 and a lower layer 16. Upper layer 12 includes a semiconductor material. The semiconductor material may be silicon.

The semiconductor material may also be any other semiconductor material as, for example, SiC, SiGe, GaAs, GaN or other III-V semiconductor materials. Upper layer 12 may comprise a single semiconductor material or more than one semiconductor material.

Upper layer 12 may be a device layer. Upper layer 12 has a thickness t. Thickness t of the device layer may define the thickness of the final semiconductor device produced according to the described method. Thickness t may be less than 100 μm (micrometer). In general, a thin semiconductor device may have a thickness of less than 100 μm. Whether a semiconductor device is considered to be a thin semiconductor device may depend on the semiconductor material. Thickness t may be between 1 μm and 50 μm. Thickness t may also be smaller than 1 μm. The thickness t may be chosen depending on the functionality of the semiconductor device to be produced.

Inner layer 14 may be an inner etch stop layer. An etch stop layer substantially stops an etch process. More specifically, an etch stop layer may be defined as a layer including a material which is not or less etched by an etching agent (or etchant) etching a layer adjacent the etch stop layer. Thus, an etch process for etching the adjacent layer is e.g. not time critical or temperature critical because the etch process is substantially stopped by the etch stop layer. In detail, for a same etchant an etch rate of the layer adjacent the etch stop layer and an etch rate of the etch stop layer may differ by a factor of at least 10. The factor may be comprised between 10 and 1000. The factor may be of about 100. The factor may be of about 1000. A factor of e.g. 100 between the etch rate for the adjacent layer and the etch stop layer means that during a given time period e.g. 100 μm (micrometer) of the adjacent layer is etched while in a same time period only 1 μm (micrometer) of the etch stop layer is etched. In other words, inner layer 14 may not be etched or may less be etched by an etching agent which can etch the semiconductor material of upper layer 12. More precisely, inner etch stop layer 14 may hardly be influenced or damaged by the etching agent used for etching upper layer 12. For example, inner etch stop layer 14 may correspond to or may include at least one of an oxide layer, a silicon oxide layer, a buried oxide layer (BOX), a nitride layer, etc. In one example, inner etch stop layer 14 may include an aluminum nitride (AlN).

Lower layer 16 may include semiconductor material. For example, lower layer 16 may be at least one out of a handle layer and a bulk wafer. A thickness T of lower layer 16 may be greater than the thickness t of the upper layer. Lower layer 16 may be configured to provide stability and/or support to the semiconductor wafer 10. Handle wafer thickness T may depend on a diameter of wafer 10. A wafer may be generally circular, rectangular or of any other form. A circular wafer may have a diameter comprised between about 25 mm (1 inch) to about 450 mm (18 inches). The diameter of a circular wafer may also be smaller or greater than the given dimensions. A wafer 10 with a diameter of about 200 mm may have a thickness T of more than 500 μm (micrometer). The thickness T may even be greater for wafer diameters of about 300 mm or about 450 mm (diameter of 8 inches, 12 inches, respectively 18 inches).

The material of lower layer 16 may be chosen such that an etchant or etching agent for lower layer 16 does less or not etch inner layer 14. In other words, inner etch stop layer 14 may also function as an etch stop layer for the lower layer 16. Inner etch stop layer 14 can thus be used as etch stop layer for etching the upper layer 12 and for etching the lower layer 16. Inner etch stop layer 14 may be doubly used.

For example, wafer 10 may be a silicon-on-insulator (SOI) wafer. An SOI wafer may be produced using an oxygen implantation process, e.g. by a so-called separation by implantation of oxygen (SIMOX). A SIMOX wafer may include a buried silicon dioxide ($SiO_2$) layer as an inner layer. An SOI wafer may also be formed by bonding directly oxidized silicon with a second substrate. An SOI wafer may also be formed by a seed method in which the upper silicon layer is grown directly on the insulator.

Figure 2:
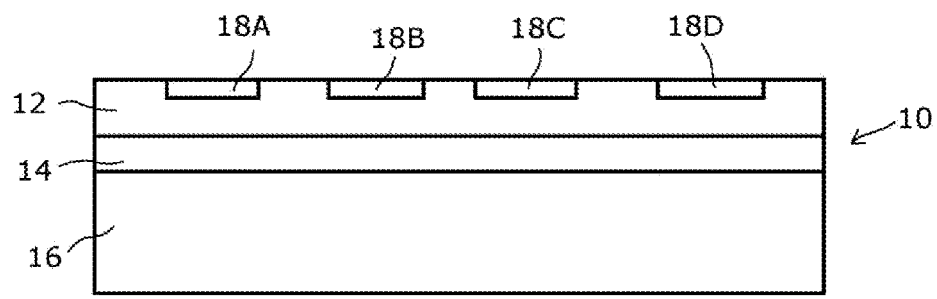
FIG. 2 schematically illustrates the semiconductor wafer after forming a plurality of functional areas.

FIG. 2 shows the wafer 10 of FIG. 1 after a first processing step. In device layer 12 a plurality of functional areas 18A, 18B, 18C and 18D is formed. Functional areas may also be referred to as active regions. In an embodiment, functional areas 18A-18D may be vertical transistors. In an embodiment, functional areas 18A-18D may be sensors. In other embodiments, functional areas 18A-18D may provide other functionalities, they may especially provide functionalities which use or require a small thickness t of the die to be produced. Although functional areas 18A, 18B, 18C and 18D are shown in the figures to extend only into part of the thickness t of the die, the functional areas may also use the entire thickness t of the device layer. In an embodiment, the functional areas 18A, 18B, 18C and 18D may have a thickness comprised between about 1 μm (micrometer) and 5 μm (micrometer). The thickness of the functional areas may be defined by the depth up to which the semiconductor of device layer 12 is modified e.g. by so-called front-end processes to achieve a desired electrical functionality. In an embodiment it might be necessary to provide a device layer thickness greater than the thickness of the functional area to achieve a desired electrical strength. The necessary thickness increases with the maximum voltage. As an example, in silicon, a thickness of 60 μm (micrometer) may be necessary to withstand a voltage of 600 V. Therefore, the device layer thickness may be greater than the thickness of the functional layer as shown in FIG. 2. On the other hand, in silicon, a thickness of 1 μm (micrometer) may be sufficient for a voltage of 1 V and the thickness of the functional area may be the same than the thickness of the device layer, the functional area extending over the whole thickness of the device layer.

Figure 3:
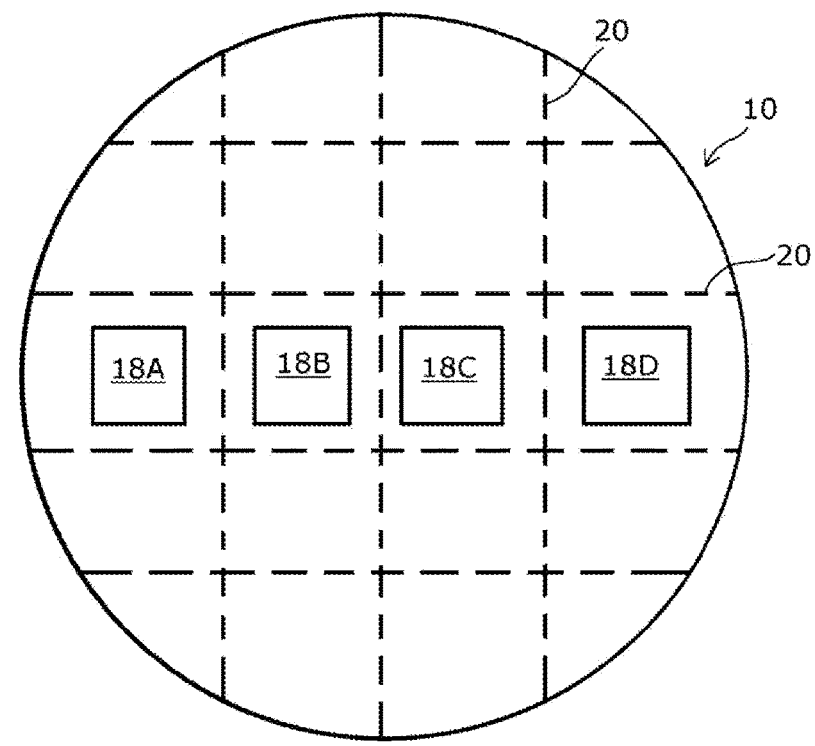
FIG. 3 schematically illustrates a top view of the semiconductor wafer of FIG. 2.

FIG. 3 shows in a top view wafer 10 including functional areas 18A, 18B, 18C and 18D. It is understood that wafer 10 may include a multitude of functional areas. For example, wafer 10 may include 10 to 1,000,000 functional areas or even less or more. For example, wafer 10 may include 10,000 to 100,000 functional areas. In FIG. 3, only four functional areas are shown for the sake of simplicity and for the purpose of explanation. The upper surface of wafer 10 may be divided into areas by scribe lines 20. Scribe lines 20 may define where wafer 10 is to be separated or diced when singulating the dies. The scribe lines 20 may indicate locations where the semiconductor wafer 10 is to be separated into individual parts later on. In particular, the scribe lines may be free of metal that has been used during manufacturing electronic structures included in the functional areas. The scribe lines may have a width from about 5 μm (micrometer) to about 5 mm. The scribe lines may have a width from about 5 μm (micrometer) to about 500 μm (micrometer). The scribe lines may have a width from about 5 μm (micrometer) to about 100 μm (micrometer) and more particular from about 15 μm (micrometer) to about 50 μm (micrometer). The width of the scribe lines may particularly depend on alignment properties and/or sensitivity of the semiconductor chips.

Functional areas 18A to 18D, or more general all functional areas formed on wafer 10, may be of the same kind of functional area or they may be equal to each other. In an embodiment, different functional areas may be formed on wafer 10. Functional areas 18A to 18D may also include functional areas needed for processing the wafer, e.g. functional areas required for future processing steps as for alignment purpose and so on.

Figure 4:
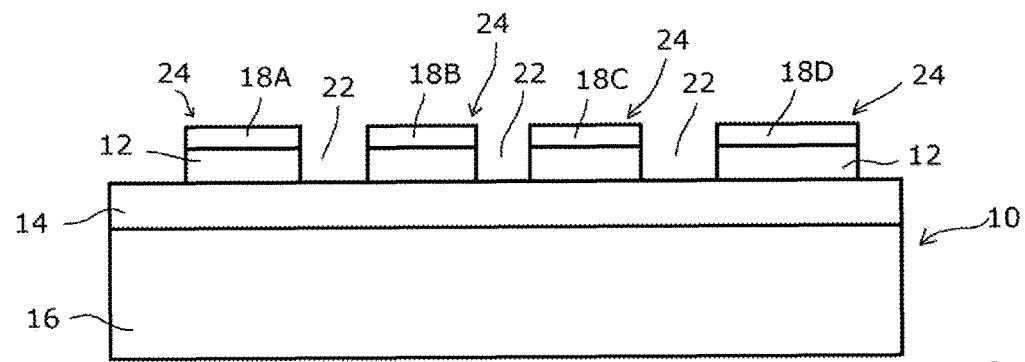
FIGS. 4 to 9 schematically illustrate in cross-sectional views a method of producing a semiconductor device in accordance with the disclosure.

FIG. 4 shows wafer 10 after a selective first etch process is performed on upper layer 12. The first etch process may be selective in that the used etchant attacks only the semiconductor material of upper layer 12, but does not necessarily attack the material of inner etch stop layer 14 which functions as an etch stop layer. The first etch process may also be selective in that trenches 22 are etched into upper layer 12 along scribe lines 20. The trenches 22 may be of arbitrary shape. Selectivity for forming the trenches may be achieved by applying a mask onto the areas which are not to be etched. The mask may be applied on the functional areas. The mask may cover regions greater than the functional areas to also protect parts of upper layer 12 surrounding the functional areas. The first selective etch process forms trenches 22 separating the functional areas from each other. The first selective etch process singulates the functional areas 18A to 18D. Trenches 22 may be etched leaving one or more functional areas together which may be interconnected later on. Functional areas 18 form with the underlying remaining upper layer 12 thin dies or chips 24. After the first etch process, they are still held together by inner layer 14 and lower layer 16.

For example, the etching process may include at least one of a sputter etching, vapor phase etching, etc. In particular, at least one of a plasma etching process and a wet etching process may be applied. The chosen etch process may depend on the semiconductor material and on the thickness t of the upper layer as well as on the material of the inner etch stop layer 14. While for a smaller thickness t of the upper layer a wet etch process may be preferable, for greater thicknesses t a dry etch process may be used. With greater thickness t a wet etch process may lead to important undercut regions underneath the functional areas.

The first etch process may etch a trench or a plurality of trenches 22 on an upper side or front side of semiconductor wafer 10, i.e. on respectively into the upper layer 12. The trench or the trenches may extend completely through the upper layer 12 to the etch stop layer 14. Thus, upper layer or device layer 12 may be completely separated or completely removed between the functional areas.

In plasma etching, the semiconductor wafer may be masked with a mask material which leaves open areas between the individual semiconductor dies defined by the functional areas. A masked semiconductor wafer may then be processed using a reactive gas plasma which may etch the semiconductor wafer material of upper layer 12 which is exposed between the semiconductor chips respectively the functional areas. Plasma etching may be performed by ionizing a gas-mix inside a chamber to obtain ions that may react with a target material. An ionization of an employed gas may be performed using a radio frequency excitation emitted by an electrode. An ionization of employed gases may be performed using a radio frequency excitation emitted by an electrode. A used plasma source (or etch species) may be charged (ions) and/or neutral (atoms and radicals). During a plasma etching process, the plasma may generate volatile etch products from chemical reactions between the elements of the material to be etched and the reactive species generated by the plasma. Atoms of the treated element may embed themselves on or below the surface of the target material such that the physical properties of the target material may be modified. The term plasma etching may refer to any suitable etching or dicing process employing a plasma, for example Reactive Ion Etching, Deep Reactive Ion Etching, Ion Beam Etching, etc.

Chemistries of gases used in a plasma etching process may particularly depend on the material to be etched. For example, a halogen (fluorine, chlorine, bromine, or iodine) gas or halogen-containing gas may be used wherein one or more additional gases may be added in order to improve a quality of an etch (e.g. etch anisotropy, mask selectivity, etch uniformity, etc.). For example, gases including fluorine, such as $SF_6$, $F_2$ or $NF_3$, may be used for an etching of silicon. Gases including chlorine and/or bromine may be used to etch III-V materials. It is understood that plasma etching may not be limited to an application in the fabrication of semiconductor devices. Rather, a plasma etching technique may also be applied to an arbitrary substrate type as long as a suitable gas chemistry to etch the substrate is available. For example, further substrate types may include carbon containing substrates (including polymeric substrates), ceramic substrates, metal substrates, glass substrates, etc.

In wet etching, an etchant may be used to provide a trench in the semiconductor material. A mask may be used to selectively remove material from the target material. A wet etching process may be isotropic, such that an etching rate may be identical in both horizontal and vertical direction, or anisotropic, such that an etching rate may be different in a horizontal and a vertical direction. In one example, a wet etching process may use hydrofluoric acid.

The devices and methods described herein may include or a employ a sacrificial material that may particularly act as a spacer or a mask during an etching process. The sacrificial layer may include at least one of a nitride, an oxide, and carbon. In particular, the sacrificial material may be made of or may include at least one of silicon nitride and silicon oxide. For example, the sacrificial material may be deposited in form of a layer having a thickness from about 100 nanometers to about 10 μm (micrometer), more particular from about 100 nanometers to about 3 μm (micrometer).

Figure 5:
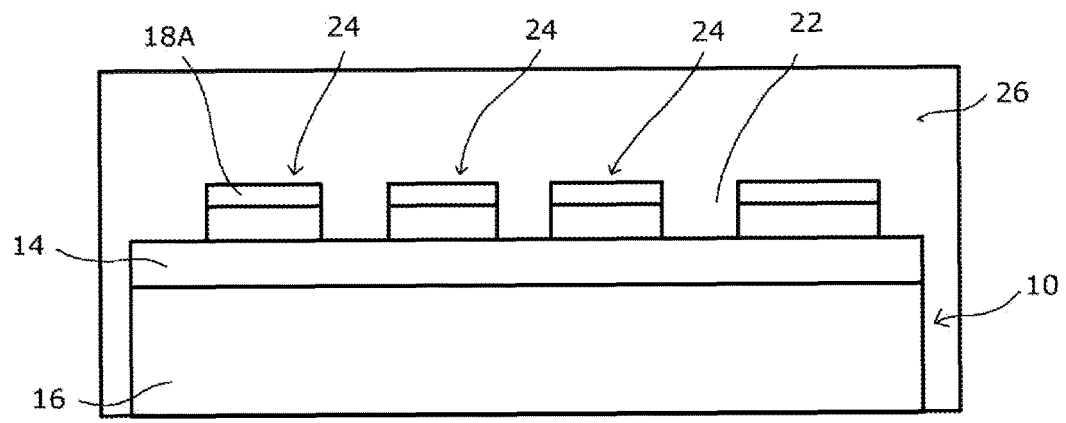

FIG. 5 shows wafer 10 including lower layer 16, inner etch stop layer 14 and the singulated dies 24 after an encapsulating is performed. It is to be understood that encapsulating is optional. In another embodiment which is not shown wafer 10 of FIG. 4 may be placed onto a temporary carrier, the functional areas 18 facing the temporary carrier. An adhesive layer may be provided between the temporary carrier and the functional areas. FIG. 5 shows an encapsulated wafer 10. Dies 24 are encapsulated by an encapsulant 26 which may be a first encapsulant. Encapsulant 26 fills the trenches 22 formed by the first etch process. In the embodiment of FIG. 5, encapsulant 26 also covers the upper side or upper faces of functional areas 18. In the embodiment of FIG. 5, the encapsulant 26 also covers the lateral sides of wafer 10. It is understood that covering the upper sides of the functional areas 18 and covering the laterals sides of wafer 10 is optional.

The encapsulating material 26 can be any electrically insulating material like, for example, any kind of molding material, any kind of epoxy material, or any kind of resin material. In special cases it may be advantageous to use a conductive encapsulant material. In the process of covering the semiconductor dies 24 with the encapsulating material, a wafer level packaging process can be carried out. The encapsulation material may be a duroplastic or thermosetting mold material. The encapsulation material may contain one or more filling materials. The encapsulation material may contain a filling material consisting of small particles of glass (SiO$_2$) or other electrically insulating filler materials like aluminum oxide (Al$_2$O$_3$), boron nitride (BN) or aluminum nitride (AlN) or organic filler materials. The encapsulation material may also contain an electrically conductive filling material like copper (Cu), silver (Ag), molybdenum (Mo) or carbon (C). The encapsulation material may also contain a filling material with magnetic properties like e.g. ferrites. The encapsulation material may, for example, be applied by compression molding, injection molding, granulate molding, transfer molding, powder molding or liquid molding.

In an embodiment, the encapsulation material 26 may be a sheet made of an electrically insulating polymer material. A polymer material may, for example, be a prepreg (short for preimpregnated fibers) that is a combination of a fiber net, for example glass or carbon fibers, and a resin, for example duroplastic material. Prepreg materials may e.g. be used to manufacture printed circuit boards. In an embodiment, the encapsulation material 26 may be homogeneous and made entirely of a same material.

In an embodiment, the encapsulating material 26 may only fill trenches 22 and not cover the upper side of functional areas 18. In a further embodiment, encapsulation material 26 may not cover the lateral sides of wafer 10. By filling the trenches 22, encapsulation material 26 may provide a protection for the dies 24.

Figure 6:
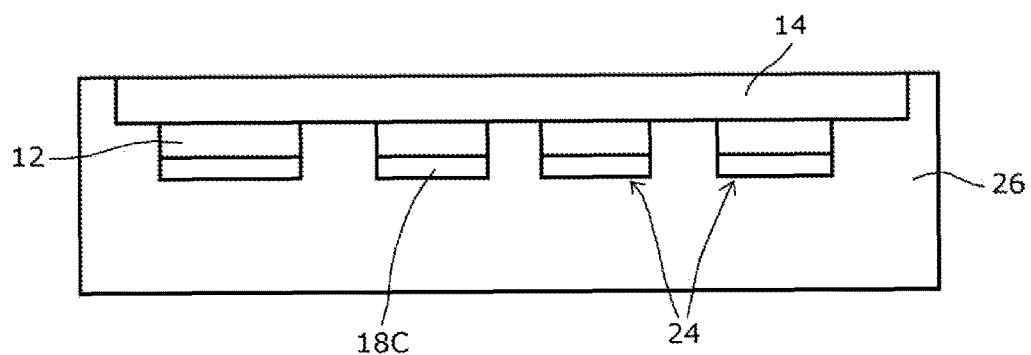

FIG. 6 shows the encapsulated wafer 10 turned about 180° with reference to the representation in FIG. 5. Lower layer or handle layer 16 has been removed. For example, handle layer 16 may have been removed by a second etch process. The second etch process may be stopped by the inner etch stop layer 14. Lower layer 16 may be removed in two steps. First, a lower part or outer part of handle layer 16 may be removed by a grinding process. Afterwards the remaining part of handle layer 16, which is next to or adjacent to inner etch stop layer 14, may be removed by the second etch process. The remaining part which is removed by the second etch process may have a thickness of about 50 µm (micrometer). The second etch process may not or hardly attack the inner etch stop layer 14, but completely removes handle layer 16. In an embodiment, where the encapsulant 26 covers also lateral faces of the semiconductor wafer, the encapsulant may also be removed to form a plane surface with the inner etch layer 14. In an embodiment where wafer 10 is placed onto a temporary carrier, lower layer 16 may be removed in the same way.

Figure 7:
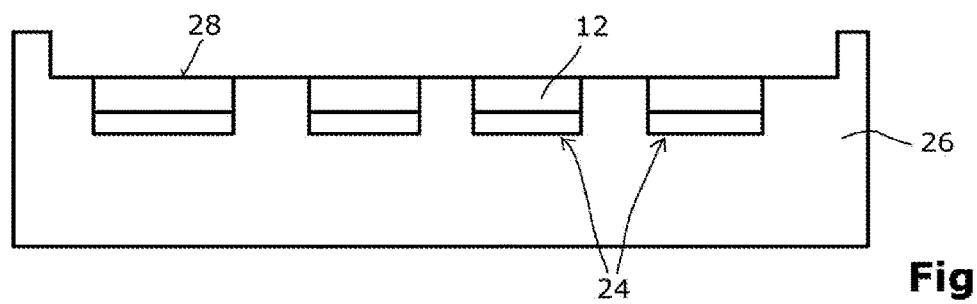

FIG. 7 shows the encapsulated dies 24 after a third etch process has been performed. The third etch process uses an etchant which etches away the inner etch stop layer 14. The etchant used in the third etch process may be selective in that it does not or hardly attack the semiconductor material of device layer 12. The third etch process completely etches away etch stop layer 14 without removing device layer 12 and without removing the encapsulant 26. Device layer 12 functions as an etch stop layer for the third etch process. After the third etch process the encapsulated dies 24 remaining in the encapsulant have a definite thickness t. A face or surface of encapsulant 26 and a surface of device layer 12 are in a same plane, they are coplanar. The common plane is defined by the removed inner etch stop layer 14. In an embodiment where wafer 10 is placed onto a temporary carrier, inner etch stop layer 14 may be removed in the same way. Since the third etch process is selective and does not or hardly attack the device layer, the uniformity of the thickness t is guaranteed throughout the whole wafer. It is the original thickness t of device layer 12. A back face 28 of the dies 24 is thus slightly etched by the third etch process. The back face 28 of the dies 24 is not attacked by any mechanical processing step. Thickness t may be very small as explained above. The dies 24 are never to be handled without a protection. The protection is provided in the beginning of the manufacturing process by the handle layer 16 and at the end of the manufacturing process by the encapsulant 26 or by the temporary carrier. No mechanical processing is necessarily performed neither on the back face 28 nor on the lateral surface extending between the back face and the front face of the dies. The lateral surface and the back face have etched surfaces. Mechanical processing may introduce micro cracks into a die. Micro cracks may develop further under environmental stress, e.g. temperature. Micro cracks may therefore lead later to defective devices. By etching the back face and the lateral face or surface no micro cracks form and failures due to micro cracks may be substantially decreased or even completely avoided.

Figure 8:
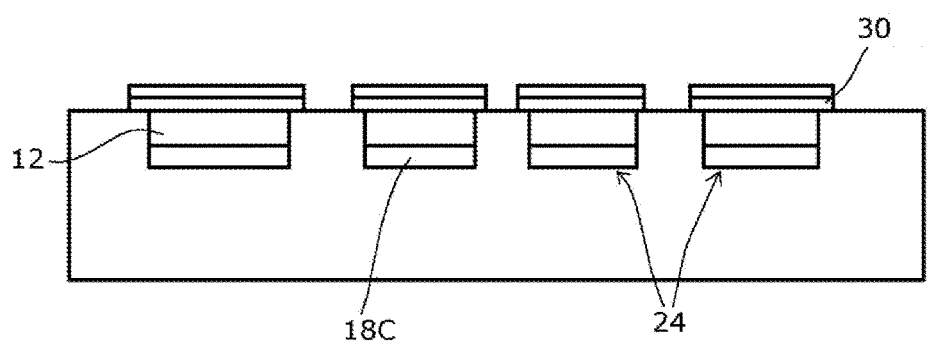

FIG. 8 shows the encapsulated dies 24 after processing the backsides of dies 24. The backsides of dies 24 may be provided with a conductive layer 30. The conductive layer 30 may extend over the whole surface of the backsides of dies 24. The conductive layer 30 may extend as shown in FIG. 8 over encapsulant 26. The conductive layer may be a so-called galvanic interconnect. The conductive layer 30 may intersect the outline of the semiconductor die 24. The conductive layer may form contact pads for the semiconductor chips allowing electrical contact to be made with the integrated circuits included in the functional areas. The conductive layer may include one or more metal layers. The metallic layers may be manufactured with any desired geometry, shape and any desired material composition. Any desired metal or metal alloy, for example aluminum, titanium, gold, silver, copper, palladium, platinum, nickel, chromium, or nickel vanadium, may be used as material. The electrically conductive material may also be formed of electrically conducting organic material or an electrically conducting semiconductor material. The backside contact formed on the backside of dies 24 may include power copper which is a thick copper layer allowing a high current to flow. The backside contact may further include a dielectric layer, for example polyimide. The electrically conductive layer may be formed on the backside of the dies by any suitable process. As an example, an electro-chemical deposition may be used. Applying a backside contact may be seen as a typical frontend process step. Dies 24 may now be completely processed. During the whole process the thin chips 24 had never to be handled separately.

Figure 9:
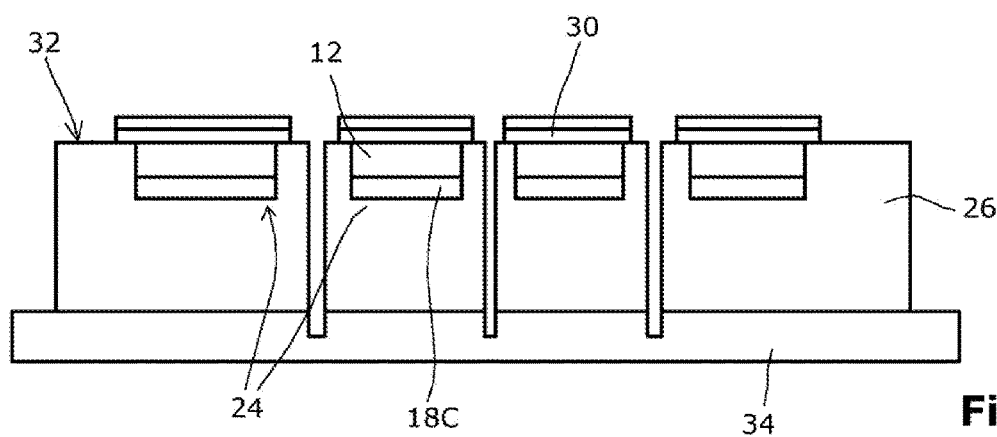

FIG. 9 illustrates dicing of the encapsulant 26 for separating the encapsulated dies 24 into individual semiconductor devices 32. Encapsulant body 26 may be arranged on a carrier 34. For example, carrier 34 may be a dicing tape. The dicing process may include an act of providing a trench or a separation trench extending through the encapsulant 26. Any suitable dicing technique may be applied, for example at least one of plate dicing (sawing), laser dicing, etching, etc. At the end of the process, illustrated in FIG. 9, individual semiconductor devices 32 may be obtained. It is understood that an individual semiconductor device 32 may include more than one encapsulated die 24, i.e. the encapsulant body 26 may not necessarily be separated between every individual chips. This allows for Systems on Chips (SoC) with the semiconductor material of the chips being completely separated allowing complete isolated areas. The isolation between separate areas may be from about 100 V to about 10 kV or even smaller or greater. The isolation between separate areas may be more specifically from about 110 V to about 2.5 kV or up to 6.5 kV depending on the encapsulation material and the distance between the encapsulated dies 24.

Each semiconductor device 32 includes a semiconductor die 24 with a functional area 18, a semiconductor material as part of device layer 12 and a backside contact 30 and encapsulant 26. The functional area 18 may use or occupy the whole device layer 12. The semiconductor die 24 has a first main face adjacent to the functional area 18 and a second main face which is opposite the first main face. The second main face may be at least partly covered by the back contact 30. The second main face may be coplanar to a face of the encapsulant 26. The back contact may extend over the encapsulant 26. The back contact may intersect an outline of the semiconductor die 24. The back contact may be formed by an electrically conductive layer, e.g. a galvanic interconnect. The lateral surface of the dies 24 has been formed by the first etching process, in other words, the lateral surface extending from the first main face to the second main face is an etched lateral surface. An etched lateral surface does not necessarily damage the semiconductor material. In contrast, dicing a semiconductor material, e.g. by sawing, may introduce stress and thus cracks or micro cracks into the semiconductor die. A crack may hinder proper function of the die, especially for the case of thin dies. A micro crack may transform over time into a crack hindering only later proper function of the die. The semiconductor device 32 includes the encapsulant 26 which encapsulates the semiconductor die 24 covering at least the lateral surface. In the embodiment of FIG. 9, the functional area is also covered. The second main face has an etched surface. The surface of the second main face has been defined when producing the three level wafer 10 and the surface has been slightly etched in the third etch process. Thus, no stress has been introduced into the second main face. The semiconductor die 24 has a well-defined thickness which may be less than 100 μm (micrometer), and more specifically between about 1 μm (micrometer) and about 50 μm (micrometer). A variation of the thickness t may be less than 1 μm (micrometer), preferably less than 0.15 μm (micrometer). The thickness of semiconductor die 24 was defined when producing the three level wafer 10.

Semiconductor devices 32 may be used and handled the same way as other surface mountable devices. Functional area 18 may be coupled to an external contact by through-contacts or wires (not shown in the figures).

In an embodiment, the semiconductor devices 32 may also be handled the same way as bare dies and may be further mounted into packages. Semiconductor device 32 is more rugged than thin die 24.

Figure 10:
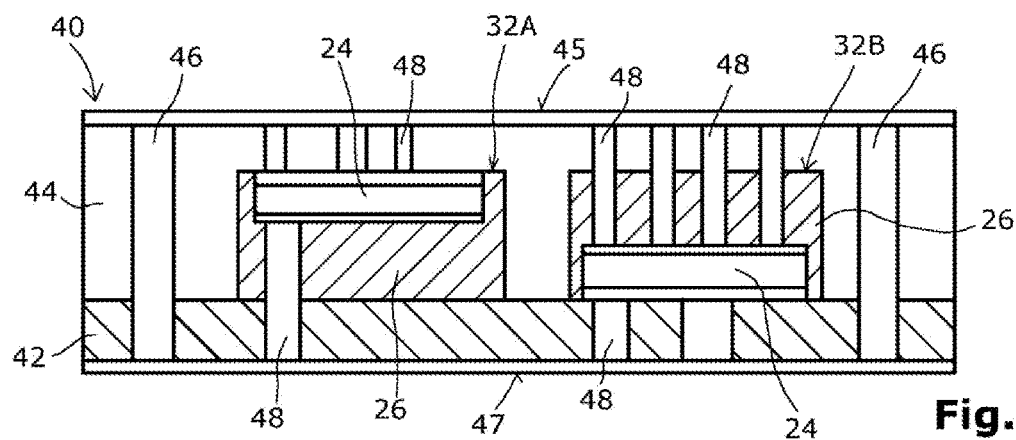
FIG. 10 schematically illustrates a cross-sectional view of a semiconductor component according to an embodiment.

FIG. 10 shows an exemplary semiconductor component 40 including a first semiconductor device 32A and a second semiconductor device 32B. First semiconductor device 32A and second semiconductor device 32B may be produced according to the method explained with reference to FIGS. 1 to 9. Semiconductor component 40 further includes a carrier 42 and an encapsulant 44 which may be a second encapsulant. Semiconductor component 40 has a first main face 45 and a second main face 47 opposite the first main face. Semiconductor device 32A is arranged on carrier 42 with the first encapsulant 26 facing the carrier 42. Semiconductor device 32B is arranged on the carrier 42 with back contact 30 facing the carrier 42. The second encapsulant 44 covers the first semiconductor device 32A, the second semiconductor device 32B and the carrier 42. Semiconductor component 40 may be provided with a first structured electrically conductive layer on the first main face 45, the first structured electrically conductive layer may form a first redistribution layer. The first main surface 45 may be or may include carrier 42. The semiconductor component 40 may further be provided on the second main surface 47 with a second structured electrically conductive layer, the second structured electrically conductive layer may form a second redistribution layer. The second main surface may be formed or may include the second encapsulant. Through-contacts 46 or vias 46 may electrically couple the first redistribution layer and the second redistribution layer. Through-contacts or vias 48 may be provided which electrically couple electrodes or contact pads of dies 24 to one or both of the electrically conductive layers 45, 47. Semiconductor component 40 may be a power module including two dies with the functionality of two vertical power MOSFETs. The second encapsulant 44 may be or may comprise the same material as first encapsulant 26. First encapsulant 26 and second encapsulant 44 may also differ from each other. Second encapsulant 44 may be a molding compound 44 and molding may be performed by any of the molding processes explained above for the first encapsulant, e.g. by compression molding or any other suitable molding process. Semiconductor component 40 may be manufactured using a printed circuit board process. Second encapsulant 44 may be laminated.

A further processing of semiconductor devices 32 is not limited to the act of packaging them to form a semiconductor component as shown in FIG. 10. There may be further ways to use or process further semiconductor devices 32. In an embodiment, a semiconductor component as shown in FIG. 10 may comprise further devices, e.g. a driver circuit. The driver circuit could be placed onto carrier 42. Furthermore, in embodiments, semiconductor component 40 may comprise logical circuitry and/or sensors. It is also possible to include microelectromechanical systems (MEMS). The further devices as e.g. driver circuit, logical circuitry, sensors and MEMS may be embedded in the second encapsulant or may be arranged on top and/or on bottom of component 40.

Figure 11:
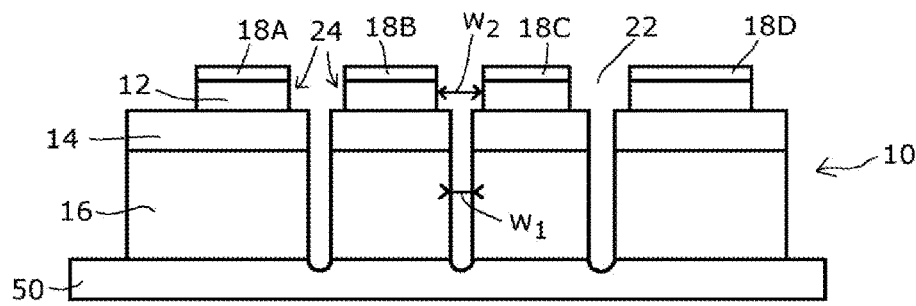
FIGS. 11 to 17 illustrate in cross-sectional views a method of producing a semiconductor device according to a further embodiment.

A further embodiment of a method for producing a semiconductor device is explained with reference to FIGS. 11 to 17. The description of method steps given with reference to FIGS. 1 to 4 may also apply to this embodiment, and FIG. 11 shows a method step effectuated after the method step of FIG. 4. FIG. 11 shows wafer 10 according to FIG. 4 with trenches 22 etched into the upper layer 12, the wafer 10 being mounted onto a carrier 50. For example, the carrier 50 may be a dicing tape. The wafer 10 is singulated into separate semiconductor chips by dicing the wafer 10 underneath at least part of the etched trenches 22. Dicing is thus effectuated through inner etch stop layer 14 and through lower layer 16 and separates the inner etch stop layer 14 and the lower layer 16. A width $w_1$ of the separating dicing trench may be smaller than a width $w_2$ of trenches 22 that have been etched into upper layer 12. Dicing of inner etch stop layer 14 and lower layer 16 may be effectuated by any of the dicing methods mentioned above. Since the width $w_1$ may be smaller than the width $w_2$, the lateral etched surfaces of chips 24 are not necessarily damaged. In the example of FIGS. 11 to 17, dies 24 are not encapsulated before a singulation. However, chips 24 are still attached to inner etch stop layer 14 and handle layer 16 when separated so that stability of the chips 24 may be assured. There is not necessarily a need to handle thin and fragile chips.

Figure 12:
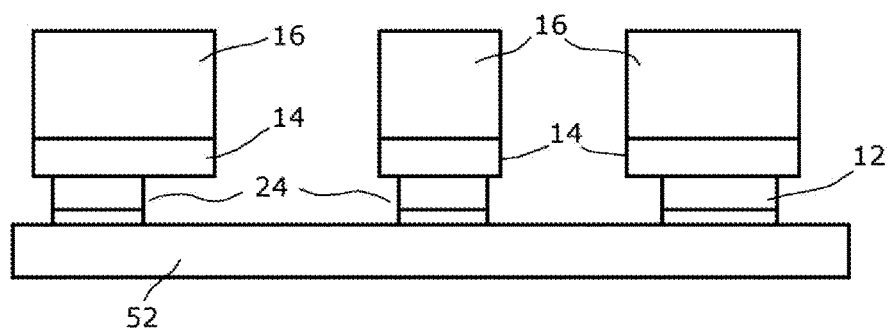

FIG. 12 shows chips 24 together with the adhering parts of inner etch stop layer 14 and handle layer 16 placed onto a carrier 52. Carrier 52 may be a temporary carrier only used during processing. Carrier 52 may be a carrier which forms part of the final device. The singulated dies 24 are placed onto carrier 52 with a distance between each other which is greater than was the distance on the wafer. The still thick chips 24 may e.g. be placed by a pick-and-place machine. The semiconductor chips 24 may be placed onto the carrier 52 together with a plurality of other semiconductor chips which can be identical in form and function with the semiconductor chips 24. In one embodiment, the chips placed onto carrier 52 may originate from different wafers and may differ in their functions. At least parts of handle layer 16 may be of a similar material. At least parts of inner etch stop layer 14 may also be of a similar material. Chips 24 may be placed onto carrier 52 with the functional areas 18 facing carrier 52.

Figure 13:
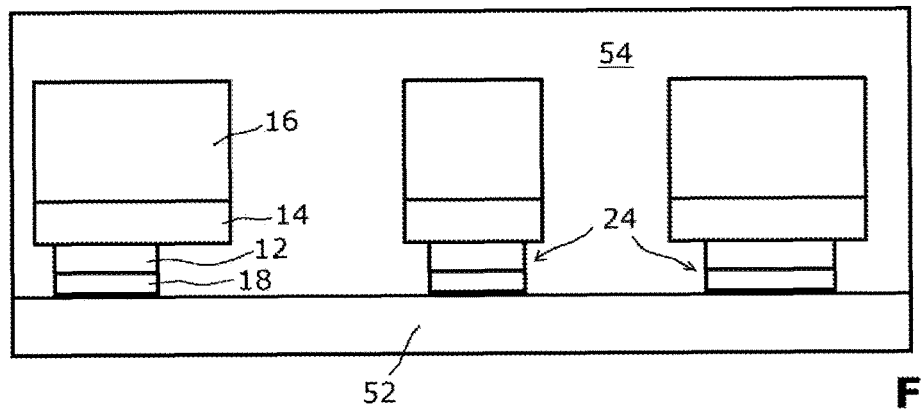

FIG. 13 illustrates a subsequent act performed. An encapsulant 54 encapsulates the separated functional areas 18 filling at least the trenches 22 between the functional areas which are enlarged by the space provided between the singulated semiconductor chips when placing them onto carrier 52. In FIG. 13 the encapsulant 54 is shown to optionally cover the handle layer 16 as well. In one embodiment, encapsulant 54 may only fill the trenches between the device layers.

Figure 14:
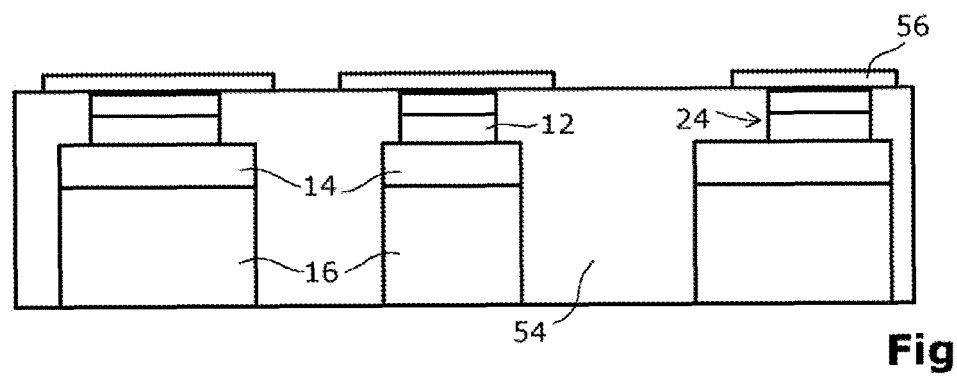

FIG. 14 shows the encapsulated chips 24 turned around 180° with reference to FIG. 13. Encapsulant 54 is shown to fill the trenches 22 and the space between the parts of inner etch stop layer 14 and the parts of handle layer 16. Encapsulant 54 is illustrated to not cover handle layer 16. Carrier 52 is removed. In an embodiment, carrier 52 may be partly removed or not removed at all. After optionally removing carrier 52, functional areas 18 have an upper exposed surface which may be coplanar with an upper face of encapsulant 54. The common plane of the exposed surface and the upper face of encapsulant 54 is defined by carrier 52 during encapsulation. The upper face faces away from the inner etch stop layer 14. The arrangement of FIG. 14 may be referred to as reconfigured wafer. Compared to the encapsulated chips of FIG. 8, the functional areas 18 are spaced further apart in the embodiment of FIG. 14, i.e. a distance between the adjacent functional areas is greater. An electrically conductive layer 54 may be formed on the upper face of encapsulant 54 and the upper surface of functional areas 18. The electrically conductive layer 54 may correspond to a redistribution layer or galvanic interconnect.

With the chips 24 placed distant from one another onto the carrier 52, additional place may be provided on the encapsulant and the reconfiguration layer can extend on the encapsulant. Such arrangement may be referred to as "fan-out". In a fan-out type package at least some of the external contact pads and/or conductor lines connecting the semiconductor chip to the external contact pads may be located laterally outside of the outline of the semiconductor chip or do at least intersect the outline of the semiconductor chip. Thus, in fan-out type packages, a peripheral part of the package of the semiconductor chip may be typically (additionally) used for electrically bonding the package to external applications, such as e.g. application boards. This outer part of the package encompassing the semiconductor chip may effectively enlarge the contact area of the package in relation to the footprint of the semiconductor chip, thus leading to relaxed constraints of package pad size and pitch with regard to later processing, e.g. second level assembly. This is achieved without the need of precious wafer area.

Figure 15:
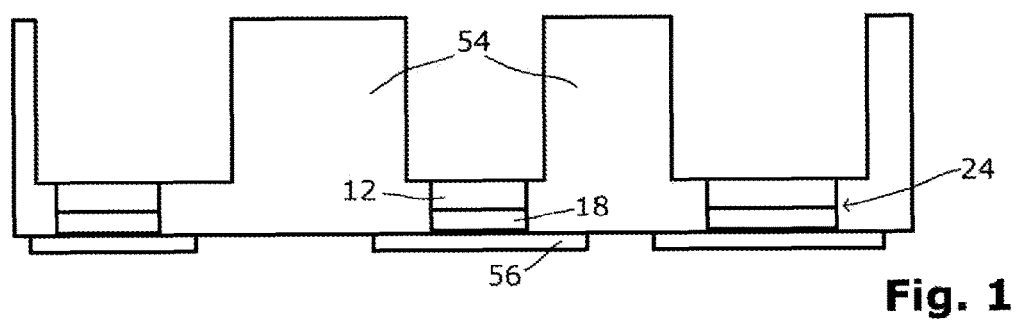

FIG. 15 shows the reconfigured wafer of FIG. 14 turned about 180° with reference to FIG. 14. The reconfigured wafer may optionally be placed on a carrier which is not shown in FIG. 15. A second etch process is performed and the handle layer 16 or the separated parts of the handle layer 16 are etched away. As previously explained, the inner etch stop layer 14 functions as etch stop layer. The etch process may be performed using any of the etch methods explained above. It is understood that parts of handle layer 16 may also be removed by a grinding step leaving e.g. only about 50 μm (micrometer) of the handle layer. However, the part of handle layer 16 which is adjacent to inner etch stop layer 14 is taken away by an etch step. In a further etch process, etch stop layer 14 may be etched away using semiconductor layer 12 or upper layer 12 as etch stop layer. In FIG. 15, the encapsulant 54 filling the space between the handle layer parts and the inner etch stop layer parts remains after etching away handle layer 16 and inner etch stop layer 14. It is to be understood that during a grinding step the encapsulant is taken away together with the handle layer. The protruding encapsulant parts remain after the etch step.

Figure 16:
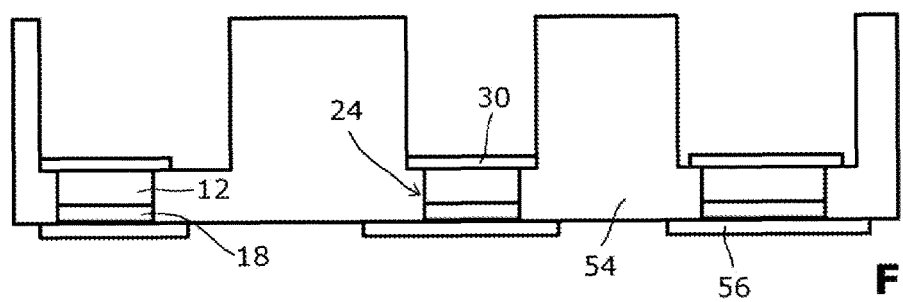

FIG. 16 shows the reconfigured wafer after removing handle layer 16 and inner etch stop layer 14. Dies 24 have now their final thickness t and a backside of the dies 24 is exposed. The final thickness t is the original thickness t of device layer 12, which may be very small, for example comprised between 1 μm (micrometer) and 50 μm (micrometer) and at least below 100 μm (micrometer). The exposed backside may be coplanar to a surface of the encapsulant 54. The common plane is defined by the removed inner etch stop layer. Backside contacts 30 may be formed as discussed with reference to FIG. 8 on the exposed die backside. Backside contacts 30 may extend onto the coplanar surface of encapsulant 54. Backside contacts 30 may intersect an outline of die 24. Backside contacts 30 may fill at least partly the space between the protruding encapsulant parts. The space between the protruding encapsulant parts may further be filled by any suitable material, e.g. an encapsulant material. The person skilled in the art understands easily that vias may be formed in the encapsulant for providing electrical contact on an outside of the encapsulant.

Figure 17:
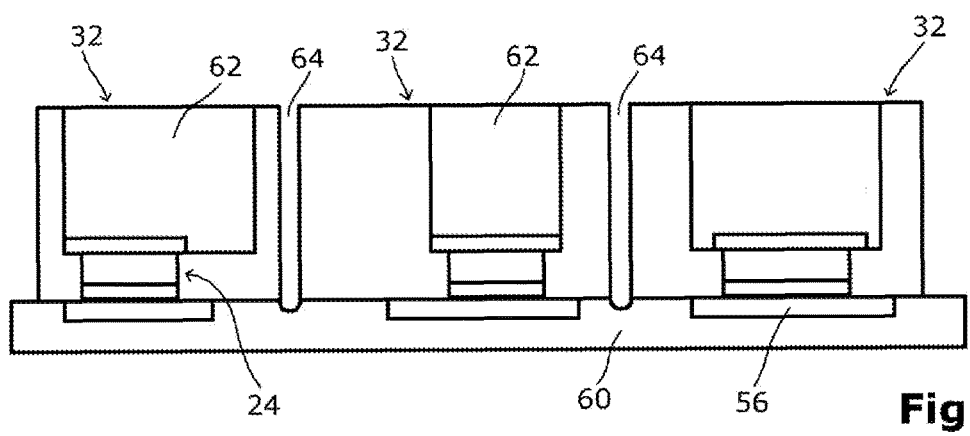

FIG. 17 illustrates a dicing step with the reconfigured wafer mounted onto a carrier 60 which may e.g. be a dicing tape. FIG. 17 shows the space between the protruding encapsulant parts filled by a further material 62. Material 62 may be chosen according to the desired function and may be e.g. an encapsulant material. The dicing tape 60 may have an elastic surface into which the electrically conductive layer 56 may sink in. Encapsulated dies 24 may be separated by any dicing process as explained above by dicing trenches 64. The semiconductor devices 32 as shown in FIG. 17 differ from each other but the person skilled in the art understands that the semiconductor devices processed in one reconfigured wafer may also be all equal.

It is understood that semiconductor devices obtained according to the embodiment explained with reference to FIGS. 11 to 17 may be further processed to form semiconductor components as explained with reference to FIG. 10.

Figure 18:
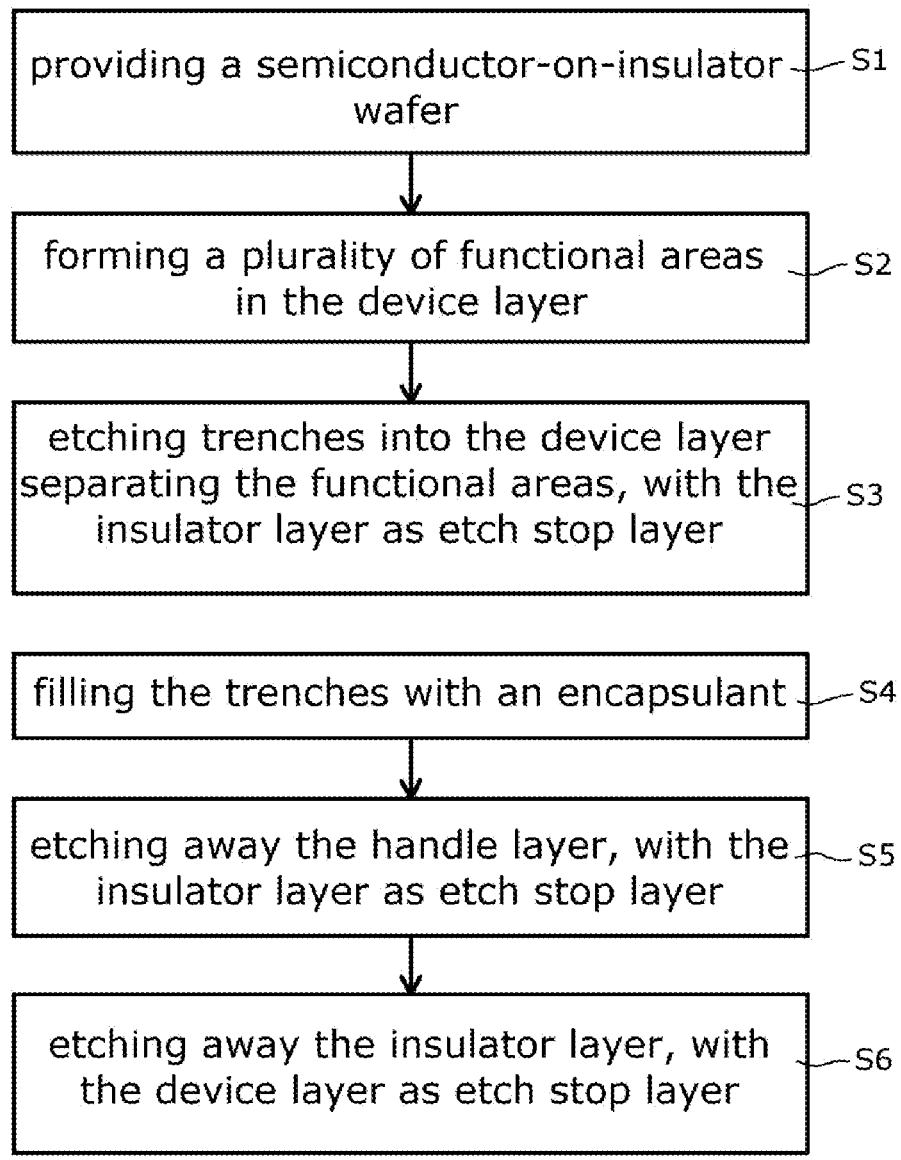
FIG. 18 illustrates a flow diagram of a method of producing a semiconductor device in accordance with the disclosure.

FIG. 18 illustrates a flow diagram of a method for producing a semiconductor device according to an embodiment. In a step S1, a semiconductor-on-insulator wafer is provided. A semiconductor-on-insulator wafer includes, as explained above, a device layer, an insulating layer and a handle layer. The insulating layer may be arranged between the device layer and the handle layer and can be used as etch stop layer for etching processes from both main surfaces of the wafer. In other words, the inner layer of the semiconductor-on-insulator wafer can be doubly used as etch stop layer for etching the device layer and for etching the handle layer.

In a step S2, a plurality of functional areas is formed in the device layer. In other words, in the device layer, acts such as at least one of doping, implanting, depositing, etc. may be performed to produce an integrated circuit according to a desired functionality. In an embodiment, the functional areas or active regions include vertical devices which require a vertical current flow. In an embodiment, the device layer is a thin device layer with a thickness below 100 µm (micrometer) and even below 50 µm (micrometer) or below 1 µm (micrometer). The thickness of the device layer defines the final thickness of the produced semiconductor dies. In an embodiment, the thickness of the functional areas may be comprised between about 1 µm (micrometer) and 5 µm (micrometer). In an embodiment, the thickness of the functional area or areas is equal the thickness of the device layer. In another embodiment, the thickness of the device layer is greater than the thickness of the functional area or areas, e.g. for providing a desired electrical strength.

In a step S3, trenches are etched in a first etching process into the device layer. The trenches separate the functional areas from each other. The trenches stop at the insulator layer which is used for a first time as etch stop layer. The trenches may be defined by a mask which is deposited on the device layer prior to etching.

In an optional step S4, the trenches are filled by an encapsulant. The encapsulant may also cover the functional areas. The functional areas may include electrical conductive layers formed by an electrically conductive material. In an embodiment the semiconductor-on-insulator wafer may be placed onto a temporary carrier.

In a fifth step S5, the handle layer is etched away. The insulator layer functions a second time as etch stop layer. Thus, there are no critical timing requirements for etching the handle layer. The handle layer can be completely removed with no or little etching of the underlying etch stop layer.

In a sixth step S6, the insulator layer is etched away to expose the backside of the semiconductor device layer. It may be the backside of the thin chips. The insulator layer may be completely etched away using the device layer as etch stop layer. Thus, the device layer is not or little etched by the etching process. Using the inventive method, the thin semiconductor dies were never to be handled separately before encapsulating. Thus, the risk of breaking the thin die or of a decreased yield because of warpage may be minimized.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific aspects shown and described without departing from the scope of the present invention. This application is intended to cover any adaptations or variations of the specific aspects discussed herein. Therefore, it is intended that this invention be limited only by the claims and the equivalents thereof.

What is claimed is:

1. A method of producing a semiconductor device, the method comprising:
   providing a semiconductor wafer, the wafer comprising an upper layer of a semiconductor material, an inner etch stop layer and a lower layer;
   forming a plurality of functional areas in the upper layer;
   performing a selective first etch process on the upper layer so as to separate the plurality of functional areas from each other by trenches etched through the upper layer, the first etch process being substantially stopped by the inner etch stop layer;
   removing the lower layer by a second etch process, the second etch process being substantially stopped by the inner etch stop layer; and
   encapsulating the separated functional areas by a first encapsulant prior to removing the lower layer, the first encapsulant filling the trenches.

2. The method of claim 1, further comprising:
   removing the inner etch stop layer by a third etch process, the third etch process being substantially stopped by the upper layer.

3. The method of claim 1, further comprising after performing the selective first etch process:
   separating the inner etch stop layer and the lower layer underneath at least part of the etched trenches to form semiconductor dies;
   placing the semiconductor dies on a carrier so that a space is provided between adjacent ones of the semiconductor dies; and
   encapsulating the semiconductor dies by a first encapsulant, the first encapsulant filling the space between adjacent ones of the semiconductor dies.

4. The method of claim 1, wherein each of the functional areas comprises an upper face, wherein the upper faces face away from the inner etch stop layer, and wherein the upper faces of the functional areas are covered by the first encapsulant.

5. The method of claim 1, wherein a lateral surface of the semiconductor wafer is covered by the first encapsulant.

6. The method of claim 1, wherein removing the lower layer comprises:
   removing a lower part of the lower layer distant from the inner etch stop layer by grinding; and
   removing an upper part of the lower layer adjacent the inner etch stop layer by etching.

7. A method of producing a semiconductor device, the method comprising:
   providing a semiconductor-on-insulator wafer comprising a device layer, an insulator layer and a handle layer;
   forming a plurality of functional areas in the device layer;
   etching trenches into the device layer so as to separate the functional areas, wherein the insulator layer functions as an etch stop layer;
   etching away the handle layer, wherein the insulator layer functions as an etch stop layer; and
   filling the trenches by a first encapsulant prior to etching away the handle layer.

8. The method of claim 7, further comprising:
   etching away the insulator layer, wherein the device layer functions as an etch stop layer.

9. The method of claim 7, further comprising:
   cutting the insulator layer and the handle layer along at least part of the trenches that separate the wafer into semiconductor dies;

placing the semiconductor dies on a carrier with a distance between each of the semiconductor dies; and filling a space between the separated semiconductor dies by a first encapsulant.

10. The method of claim 8, further comprising:

forming a metallization layer on a back side of the functional areas, the back side being exposed after etching away the insulator layer.

11. A semiconductor device, comprising:

a semiconductor die comprising a functional area, a first main face adjacent the functional area, an etched second main face opposite the first main face, and an etched lateral surface extending from the first main face to the second main face, wherein the lateral surface completely surrounds the functional area; and an encapsulant encapsulating the semiconductor die, covering directly at least the lateral surface.

12. The semiconductor device of claim 11 further comprising:

an encapsulant encapsulating the semiconductor die, covering at least the lateral surface.

13. The semiconductor device of claim 12, wherein the encapsulant comprises a first face extending in a same plane as the first main face of the semiconductor die, the semiconductor device further comprising a first electrically conductive layer extending over the first face of the encapsulant and the first main face of the semiconductor die.

14. The semiconductor device of claim 12, wherein the encapsulant comprises a second face extending in a same plane as the second main face of the semiconductor die, the semiconductor device further comprising a second electrically conductive layer extending over the second face of the encapsulant and the second main face of the semiconductor die.

15. The semiconductor device of claim 11, wherein each of the first and second main faces of the semiconductor die comprise an electrical contact.

16. The semiconductor device of claim 11, wherein a thickness of the semiconductor die between the first main face and the second main face is between 1 micrometer and 50 micrometer.

17. The semiconductor device of claim 16, wherein a variation of the thickness is less than 1 micrometer.

18. A semiconductor component, comprising:

a first semiconductor device;

a second semiconductor device, wherein each of the first semiconductor device and the second semiconductor device comprises: a semiconductor die comprising a first main face and an etched second main face opposite the first main face, and an etched lateral surface extending from the first main face to the second main face, the lateral surface completely surrounding a functional area of the semiconductor die; and a first encapsulant encapsulating the semiconductor die, covering directly at least the lateral surface;

a carrier, wherein the first semiconductor device is arranged on the carrier with the first main face facing the carrier and the second semiconductor device is arranged on the carrier with the second main face facing the carrier; and a second encapsulant which covers the first semiconductor device, the second semiconductor device and the carrier.

19. The semiconductor component of claim 18, further comprising:

a structured electrically conductive layer extending over a surface of the second encapsulant or over a surface of the carrier; and a through connection interconnecting a main face out of the first main face and the second main face of the first or the second semiconductor device with the structured electrically conductive layer.

20. A method of producing a semiconductor device, the method comprising:

providing a semiconductor wafer, the wafer comprising an upper layer of a semiconductor material, an inner etch stop layer and a lower layer;

forming a plurality of functional areas in the upper layer;

performing a selective first etch process on the upper layer so as to separate the plurality of functional areas from each other by trenches etched through the upper layer, the first etch process being substantially stopped by the inner etch stop layer;

removing the lower layer by a second etch process, the second etch process being substantially stopped by the inner etch stop layer; and removing the inner etch stop layer by a third etch process, the third etch process being substantially stopped by the upper layer.

* * * * *